United States Patent
Alshinnawi et al.

(10) Patent No.: US 9,696,235 B2
(45) Date of Patent: Jul. 4, 2017

(54) MANAGING WATER LEAKAGE FROM A WATER COOLING SYSTEM WITHIN A COMPUTE NODE

(71) Applicant: Lenovo Enterprise Solutions (Singapore) Pte. Ltd., Singapore (SG)

(72) Inventors: Shareef F. Alshinnawi, Apex, NC (US); Gary D. Cudak, Wake Forest, NC (US); Mark E. Steinke, Durham, NC (US); Edward S. Suffern, Durham, NC (US); J. Mark Weber, Wake Forest, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 287 days.

(21) Appl. No.: 14/661,490

(22) Filed: Mar. 18, 2015

(65) Prior Publication Data
US 2016/0273996 A1 Sep. 22, 2016

(51) Int. Cl.
*G01M 3/32* (2006.01)
*F24F 11/00* (2006.01)
*H05K 7/20* (2006.01)

(52) U.S. Cl.
CPC ............ *G01M 3/32* (2013.01); *F24F 11/0001* (2013.01); *H05K 7/20272* (2013.01); *H05K 7/20727* (2013.01); *F25B 2500/222* (2013.01)

(58) Field of Classification Search
CPC . G01M 3/32; H05K 7/20272; H05K 7/20727; F24F 11/0001; F25B 2500/222
See application file for complete search history.

(56) References Cited

U.S. PATENT DOCUMENTS 4,727,826 A * 3/1988 Draper .................. F22B 1/165
122/379
6,430,944 B1 8/2002 Ozawa
(Continued)

FOREIGN PATENT DOCUMENTS

EP 000257689 A2 3/1988
JP 4412385 B2 * 2/2010 ........ F25B 2500/222

OTHER PUBLICATIONS

Philippus J. Feenstra et al., "Modeling and Instrumentation for Fault Detection and Isolation of a Cooling System", 2000 IEEE. pp. 365-372. (This document only identifies the year of publication (without the month), but the year of publication is sufficiently earlier than the effective U.S. filed and any foreign priority date so that the particular month of publication is not in issue. See MPEP 609.04(a)).

*Primary Examiner* — Hezron E Williams
*Assistant Examiner* — Marrit Eyassu
(74) *Attorney, Agent, or Firm* — Jeffrey L. Streets

(57) ABSTRACT

Water is circulated through a cooling system within a compute node to remove heat from a heat-generating component within the compute node. Water leakage from the cooling system is collected into a containment reservoir within the compute node. A rate of the water leakage is measured, a temperature of the compute node is measured, a rate of water evaporation from the containment reservoir is determined based upon the measured temperature, and the rate of water leakage is compared to the rate of water evaporation to determine whether water is accumulating in the containment reservoir. A period of time before the containment reservoir reaches a critical level may also be determined.

20 Claims, 4 Drawing Sheets

(56) References Cited

U.S. PATENT DOCUMENTS

| | | | |
|---|---|---|---|
| 6,828,889 B1 * | 12/2004 | Zaput | G01R 33/3815 |
| | | | 324/318 |
| 7,076,373 B1 | 7/2006 | Munsterhuis et al. | |
| 7,270,174 B2 | 9/2007 | Chu et al. | |
| 2005/0126276 A1 * | 6/2005 | Chu | G01F 1/007 |
| | | | 73/149 |
| 2006/0197238 A1 * | 9/2006 | Forstmanis | B01D 1/305 |
| | | | 261/78.2 |
| 2009/0301123 A1 * | 12/2009 | Monk | F24F 11/0001 |
| | | | 62/259.2 |
| 2012/0210776 A1 * | 8/2012 | So | G01N 25/66 |
| | | | 73/73 |
| 2012/0324985 A1 | 12/2012 | Gu et al. | |
| 2013/0094139 A1 | 4/2013 | Campbell et al. | |
| 2013/0205822 A1 | 8/2013 | Heiland et al. | |
| 2014/0218859 A1 * | 8/2014 | Shelnutt | G06F 1/206 |
| | | | 361/679.46 |

* cited by examiner

MANAGING WATER LEAKAGE FROM A WATER COOLING SYSTEM WITHIN A COMPUTE NODE

BACKGROUND

Field of the Invention

The present invention relates to methods and systems for detecting and managing water leakage in a water cooled computer system.

Background of the Related Art

Computer systems are being designed and built with an ever increasing number of heat generating components. Given the limited footprint of most computing systems, a continuous increase in the number of heat generating components creates challenging heat dissipation issues. If these issues are not dealt with adequately, high temperatures can harm the structural and data integrity of the computer system, making the effect felt both at a system and component level.

Most electronic packages or nodes in large computer environments are housed in chassis disposed in racks. Traditionally, these nodes have been cooled by forced air cooling using air moving devices, such as fans and blowers, selectively disposed somewhere in the environment to allow optimum air flow. These air moving devices are often designed to displace hot air away from the components by creating parallel air flow paths that circulate through the chassis and rack. Air moving systems may take the form of a computer room air conditioning (CRAC) system, a chassis fan system, or a group of fans in an individual node or group of nodes.

As the density and performance of heat generating components increases, air cooling solutions are becoming more prohibitive and costly. In recent years, attention has been directed to cooling high heat flux microprocessor modules. However, with an increase in bandwidth and server throughput, large amounts of on-board memory with increasing power consumption are also required to achieve increased performance. There may be many different ways in which water-cooling can be beneficially used within a compute system.

More recently, direct or indirect water cooling has become a more attractive option for the designers of computing systems. Water cooled structures have been shown in some circumstances, such as large data centers, to consume less energy. However, these water cooled systems are susceptible to leak and require periodic maintenance to prevent the water from damaging the very computer systems that are being cooled.

BRIEF SUMMARY

One embodiment of the present invention provides a method comprising circulating water through a cooling system within a compute node to remove heat from a heat-generating component within the compute node. Water leakage from the cooling system is collected into a containment reservoir within the compute node. The method further comprises measuring a rate of the water leakage, measuring a temperature of the compute node, determining a rate of water evaporation from the containment reservoir based upon the measured temperature, and comparing the rate of water leakage and the rate of water evaporation to determine whether water is accumulating in the containment reservoir.

Another embodiment of the present invention provides a computer program product comprising a computer readable storage medium having program instructions embodied therewith, the program instructions executable by a processor to cause the processor to perform a method. The method comprises circulating water through a cooling system within a compute node to remove heat from a heat-generating component within the compute node, and collecting water leakage from the cooling system into a containment reservoir within the compute node. The method further comprises measuring a rate of the water leakage, measuring a temperature of the compute node, determining a rate of water evaporation from the containment reservoir based upon the measured temperature, and comparing the rate of water leakage and the rate of water evaporation to determine whether water is accumulating in the containment reservoir.

DETAILED DESCRIPTION

Figure 1:
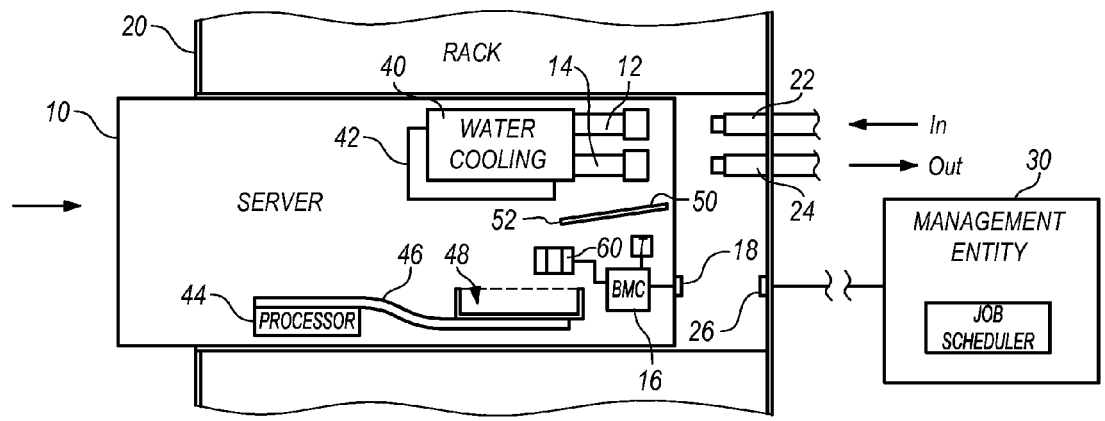
FIG. 1 is a diagram of a water cooled server being inserted into a bay of a rack with water connections aligned for blind-mating with water connections in the server.

One embodiment of the present invention provides a method comprising circulating water through a cooling system within a compute node to remove heat from a heat-generating component within the compute node. Water leakage from the cooling system is collected into a containment reservoir within the compute node. The method further comprises measuring a rate of the water leakage, measuring a temperature of the compute node, determining a rate of water evaporation from the containment reservoir based upon the measured temperature, and comparing the rate of water leakage and the rate of water evaporation to determine whether water is accumulating in the containment reservoir.

The compute node may be any of a variety of information management and communication devices that require cooling, such as servers, network switches, and management modules. Furthermore, the heat-generating components may be any of a variety of components that may be installed in a compute node, such as processors and memory modules.

The cooling system within the compute node is typically a portion of a much larger rack cooling system or datacenter cooling system that provides cooling to multiple compute nodes. For example, a datacenter cooling system may provide a source of cool or ambient water to a rack and a return or drain line for carrying warm water away from the rack. Similarly, a rack cooling system may provide the source of cool or ambient water to individual compute nodes and a return or drain line for carrying warm water away from the individual compute nodes. The cooling system within the compute node may be a water-cooled heat exchanger in thermally conductive contact with a heat-generating component. Some embodiments of the cooling system within the compute nodes may be in thermally conductive contact with multiple heat-generating components within a single compute node. Optionally, compute node may include a pair of quick connect fittings that blind mate with a mating pair of quick connect fittings that are disposed in a distal end of a bay in the rack. Such quick connections are highly advantageous, but are subject to water leakage, for example due to any misalignment of the fittings, or damage or aging of o-ring seals.

The compute node includes a containment reservoir that collects the water leakage within the compute node. Accordingly, the containment reservoir and any water within the containment reservoir is assumed to be present at the prevailing temperature within the compute node. While a temperature sensor may be specifically disposed in the containment reservoir for the purpose of measuring water temperature, the compute node will preferably include a baseboard management controller that already measures the temperature within the compute node. The rate of water evaporation from the containment reservoir may be determined based upon the measured temperature, such as by accessing a predetermined correlation between the rate of water evaporation and the measured temperature. Such a correlation may be empirically determined and stored in a table, graph or equation for use by the baseboard management controller.

The rate of water leakage may be measured in various ways, including periodically weighing accumulated water in the containment reservoir, monitoring a water level in the containment reservoir, measuring sound or other vibrations associated with impact of water droplets in the containment reservoir. A water level in the containment reservoir may be measured with a float, conductivity sensors, or optical sensors at various points in the containment reservoir. However, the rate of water leakage is preferably measured by the number of water drops being leaked. It is reasonable to approximate that twenty drops of water are the equivalent of one cubic centimeter ($cm^3$) or one gram of water.

In another embodiment, the compute node includes a baseboard management controller that receives an electronic signal from a droplet detector to determine the rate of water leakage. A droplet detector may provide a signal to the baseboard management controller every time a droplet is detected or periodically report the number of droplets detected in a given period of time. In this manner, the baseboard management controller can determine the rate of water leakage by counting drops of water as a function of time. A non-limiting example of a droplet detector a light source and a light sensor disposed at a drop location. As droplets pass between the light source and the light sensor, the amount of light detected by the sensor varies momentarily, enabling a signal to the baseboard management controller. Preferably, a water collection pan is used to direct water leakage from one or more sources to a drop location above the containment reservoir, wherein the droplet detector is disposed between the drop location and the containment reservoir.

After measuring the rate of the water leakage and measuring the temperature of the compute node, it is possible to make various determinations. As previously stated, the measured temperature of the compute node may be used to determine the rate of water evaporation from the containment reservoir. Then, the rate of water leakage and the rate of water evaporation may be compared to determine whether water is accumulating in the containment reservoir. If the rate of water leakage is greater than the rate of water evaporation, the method may determine a rate of water accumulation in the containment reservoir.

Still further, the method may determine a time period before the water in the containment reservoir will reach a critical level by dividing a known volume of the containment reservoir by the rate of water accumulation. The critical level may be any predetermined level, but is preferably a level just before water will overflow the containment reservoir. Optionally, the method identifies a job that can be completed by the compute node within the time period, and schedules the identified job to be run by the compute node. In a further option, the compute node may be shut down in response to the water level reaching the critical level.

As previously mentioned, a datacenter or rack may include any number of individual compute nodes that each include a cooling system. The methods disclosed herein may be performed in each of the individual compute nodes to identify water leakage and determine, for example, a time period before the water in the containment reservoir will reach a critical level. The method may further include determining a priority for servicing the water leakage in the compute node among a plurality of compute nodes each experiencing water leakage. Optionally, the priority may be determined by listing the compute nodes with water leakage in ascending order of time period before the water in the containment reservoir will reach a critical level. Therefore, the compute nodes that are expected to have their containment reservoir overflow the soonest are assigned the highest priority for service. Alternatively, the priority determination may consider the importance of a given compute node in a network configuration or the importance of a job being run on the given compute node. For example, the priority may be determined by giving weight to both the time period before reaching a critical level and the importance of the compute node or job.

In yet another embodiment, the method may take steps to increase the time period before the water in the containment reservoir will reach a critical level. This may be done by taking various steps that result in an increase in the measured temperature of the compute node, and therefore an increase in the rate of water evaporation from the containment reservoir. The following is a non-limiting list of such steps:

(1)—scheduling an additional job to the compute node in order to increase the rate of evaporation from the containment reservoir within the compute node. Optionally, the additional job may be an industry standard benchmark workload.

(2)—migrating a job to the compute node from another compute node in the rack, a cluster, or the datacenter.

(3)—migrating a first job to the compute node from a second compute node, and migrating a second job from the second compute node to the compute node, where execution of the first job generates more heat than execution of the second job.

(4)—managing workload handled by a target heat-generating component within the compute node to increase the rate of evaporation, wherein the target heat-generating component is in thermally conductive communication with the containment reservoir. For example, if the containment reservoir is disposed in thermally conductive communication with a graphics processor, either directly or by use of a heat pipe, then increasing the workload on the graphics processor will increase the rate of water evaporation.

When a job is submitted for execution on a cluster, a job scheduler is able to allocate free servers to execute a specific job. The job scheduler understands the server layout of the compute cluster, which servers are occupied executing jobs and which servers are idle. Also the job scheduler understands the load that a specific job will have on a particular server. The load on the specific server can be directly correlated to the amount of power consumed and the amount of heat generated. Even if the power and thermal characteristics of the job are not known or if no jobs exist in the queue for execution, standard benchmark jobs can be substituted in the servers to increase the thermal output. These standard benchmark jobs will consume known amounts of power and generate certain thermal characteristics. With this information, the baseboard management controller can work in cooperation with the job scheduler to direct jobs to areas of water leakage.

Another embodiment of the present invention provides a computer program product comprising a computer readable storage medium having program instructions embodied therewith, the program instructions executable by a processor to cause the processor to perform a method. The method comprises circulating water through a cooling system within a compute node to remove heat from a heat-generating component within the compute node, and collecting water leakage from the cooling system into a containment reservoir within the compute node. The method further comprises measuring a rate of the water leakage, measuring a temperature of the compute node, determining a rate of water evaporation from the containment reservoir based upon the measured temperature, and comparing the rate of water leakage and the rate of water evaporation to determine whether water is accumulating in the containment reservoir.

The foregoing computer program products may further include computer readable program code for implementing or initiating any one or more aspects of the methods described herein. Accordingly, a separate description of the methods will not be duplicated in the context of a computer program product.

FIG. 1 is a diagram of a water cooled compute node, in the form of a server 10, being inserted into a bay of a rack 20 with water couplings 22, 24 aligned for blind-mating with water couplings 12, 14 in the server. The act of inserting the server 10 in a rack bay of appropriate dimensions aligns the couplings of the server with the couplings of the rack. The server and rack may include other water couplings or electronic couplings (not shown), such as for receiving power and establishing network communications. In fact, the server 10 includes a baseboard management controller ("BMC") 16 with a connector 18 that is aligned for connecting with a rack connector 26 for the purpose of establishing out-of-band communication with a management entity 30.

The server 10 is shown having a water cooling system 40 that is used to remove heat from one or more heat-generating component 42 of the server 10. For example, the heat-generating component may be a processor or a memory module. The water cooling system 40 is preferably configured and positioned for direct thermal communication with the heat-generating component 42. Assuming that the couplings 12, 14 are the primary source of water leakage during use, a water collection pan 50 is disposed to extent under the couplings 12, 14 and slope downward to a drop location 52. Directly below the drop location 52, a droplet detector 60 is positioned to detect each drop of water and generate a signal to the BMC 16.

The processor 44 runs jobs and generates heat within the server. This heat may be transferred into the air within the server or passed through a heat bus or heat pipe 46 to a containment reservoir 48. The amount of workload executed by the processor 44, for example, directly affects the temperature within the server and the rate of water evaporation from the containment reservoir. In a water cooled server, there is typically no forced air flow through or between the servers in the rack.

Figure 2:
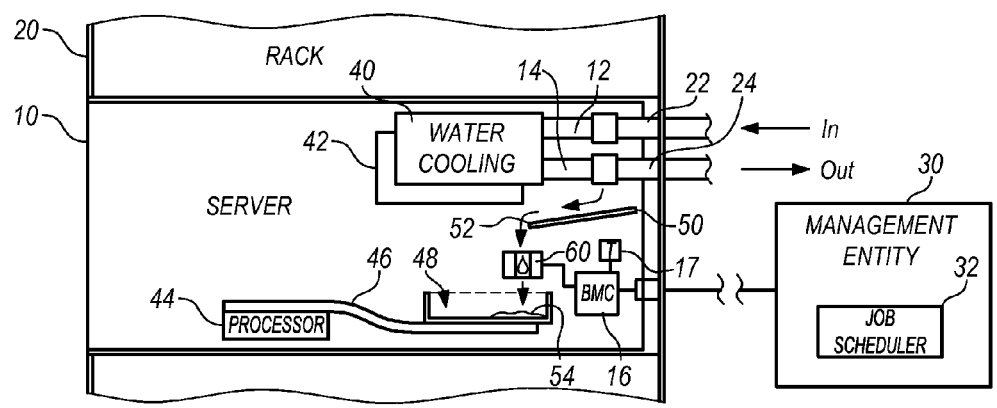
FIG. 2 is a diagram of the server and rack of FIG. 1 after the server is fully inserted into an operable position with the water connections secured.

FIG. 2 is a diagram of the server 10 and the rack 20 of FIG. 1 after the server is fully inserted into an operable position with the water couplings 12, 14 of the server connected to the water couplings 22, 24 of the rack. Accordingly, water may flow from the water supply inlet coupling 22, through the water cooling system inlet coupling 12 to the water cooling system 40 where heat is transferred from the heat-generating component 42 to the water. The warmed water then exits through the water cooling system outlet coupling 14 and water supply outlet coupling 24.

During use, any water leakage from the connection between the inlet couplings 12, 22 or the connection between the outlet couplings 14, 24 is captured by a water collection pan 50 disposed below the connections. The water collection pan 50 is downwardly sloped to the drop location 52 so that the droplet detector 60 can detect each drop of water leakage as it passes into the containment reservoir 48. As shown, a small amount of water 54 has accumulated in the bottom of the containment reservoir 48.

The BMC 16 is in communication with the droplet detector 60 and receives a signal for each drop detected or a signal indicating the number of drops per unit of time. This enables the BMC to determine the water leakage rate. The BMC is also able to measure a temperature within the server 10, such as with a temperature sensor 17. The measured temperature enables the BMC to determine a water evaporation rate from the reservoir.

With or without use of the heat pipe 46, heat is generated by the heat-generating component 42, the processor 44, and other electronic components within the server 10. As a result, the component temperatures as well as the air temperature within the server 10 will increase. The temperature on the exposed surface of the water 54 within the containment reservoir is assumed to be the same as the air temperature within the server 10. The air temperature measured by the temperature sensor 17 may therefore be used determine a water evaporation rate. Optionally, the water evaporation rate may be increased by scheduling additional jobs (workload) on the processor 44, the heat-generating device 42, or other components within the server 10. For example, the BMC may notify the management entity 30 that the server 10 has a water leakage rate exceeding a water evaporation rate. Accordingly, the management entity 30 may use a job scheduler 32 to schedule additional jobs, or different job for the processor 44 or other heat-generating components within the server in order to generate more heat within the server and increase the temperature within the server.

Figure 3:
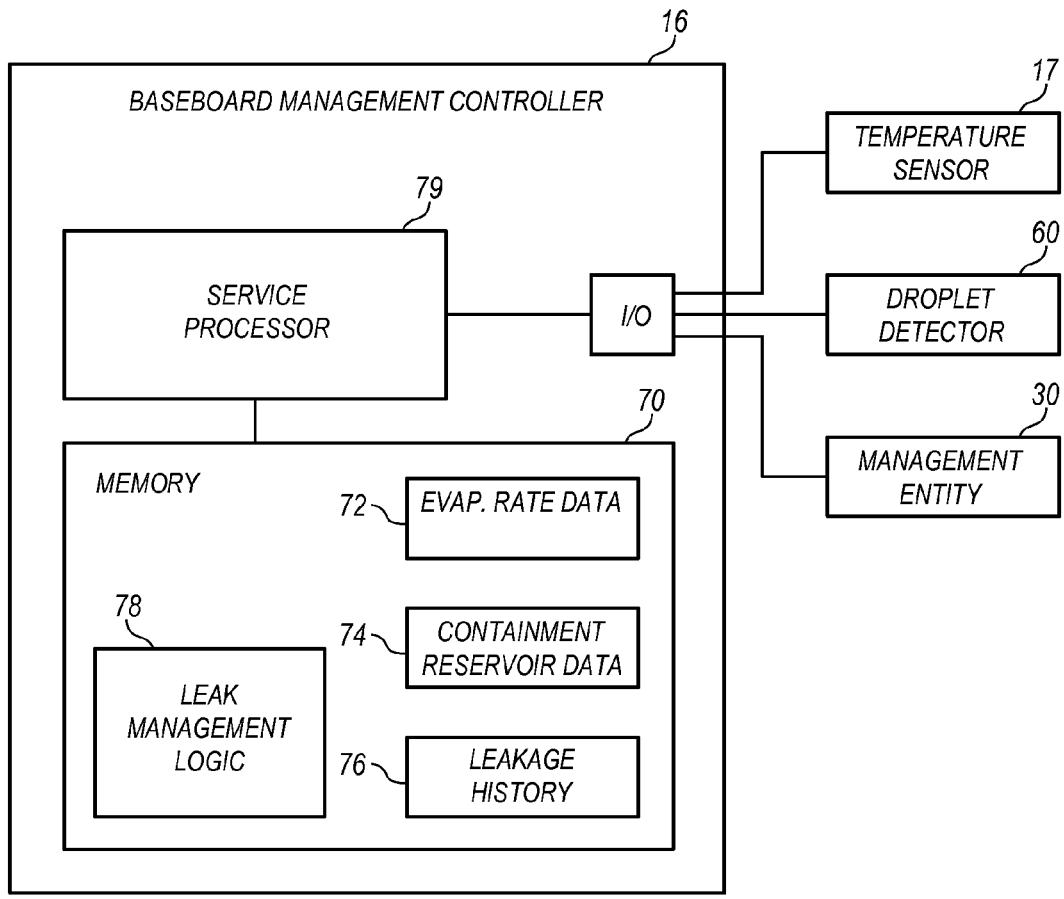
FIG. 3 is a block diagram of a baseboard management controller connected to a temperature sensor and a droplet detector.

FIG. 3 is a block diagram of the baseboard management controller 16 in communication with the temperature sensor 17, the droplet detector 60, and the management entity 30. The BMC 16 receives a temperature signal from the temperature sensor 17, then the service processor 79 uses the temperature to lookup a corresponding rate of water evaporation in its evaporation rate data 72 that is stored in memory 70. The BMC 16 also receives signals from the droplet detector 60 and stores this data in the leakage history 76. Using the number of droplets per unit of time, the BMC can determine a water leakage rate.

The BMC may also execute leak management logic 78 to make various determinations, send various requests to the management entity 30, or issue various alerts or alarms. For example, the BMC knows the volume of the containment reservoir 48 and measures the ambient temperature of the air within the server. Based on the water leakage rate, the water evaporation rate, and the volume of the containment reservoir, the BMC can calculate an amount of time before the containment reservoir reaches a critical level. Furthermore, this information allows the BMC 16 and/or the management entity 30 to schedule service to fix the leak in a timely manner. If the time to service is determined for multiple nodes, then the BMC or management entity may prioritize or rank the need to service each node in ascending order of time to service. If the water evaporation rate is greater than the water leakage rate, then the leak may not require service.

The BMC 16 may make a request, or otherwise provide information, to the management entity 30 such that a job scheduler may move one or more jobs with high thermal output to the server with the leak or a specific area or component of the server with the leak in order to increase the evaporation rate and delay the need for service. Optionally, test measurements may be made prior to deployment of any given server configuration in order to quantify an amount of water temperature increase that will occur as a result of running various applications or benchmarks (workload) in the server with the leak. Then, the method may update its determination of an amount of time before the leak must be serviced (i.e., time to required service). By moving applications to the leaking system, the method may be able to prolong the time to service until a normally scheduled maintenance window is available.

Optionally, the BMC 16 may send one or more alert or alarm message to the management entity 30. For example, the BMC may set a first level of leakage alert if the evaporation rate exceeds the (non-zero) water leakage rate, set a second level of leakage alert if the leakage rate exceeds the evaporation rate, and set a third level of leakage alert if the amount of water in the containment reservoir exceeds a setpoint amount.

In one example, the BMC has access to the volume of the containment reservoir and the volume of each droplet, and can therefore determine how many drops of water can be held in the containment reservoir. The BMC can also determine how many drops are evaporated over a period of time based on the measured temperature. So, assume that the containment reservoir holds 100 drops of water, the BMC detects a drop of water leakage every 30 minutes, and the temperature in the server is 25° C. such that a drop of water evaporates every 33 minutes. So, the water evaporation rate is less than the water leakage rate by about 10%. This equates to a drop of water accumulating in the containment reservoir every 300 minutes (one drop @ 10% volume times a drip rate of one drop every 30 minutes) or five hours. At that rate, the service person has 500 hours (about 21 days) to fix the leak before the containment reservoir is full.

Figure 4:
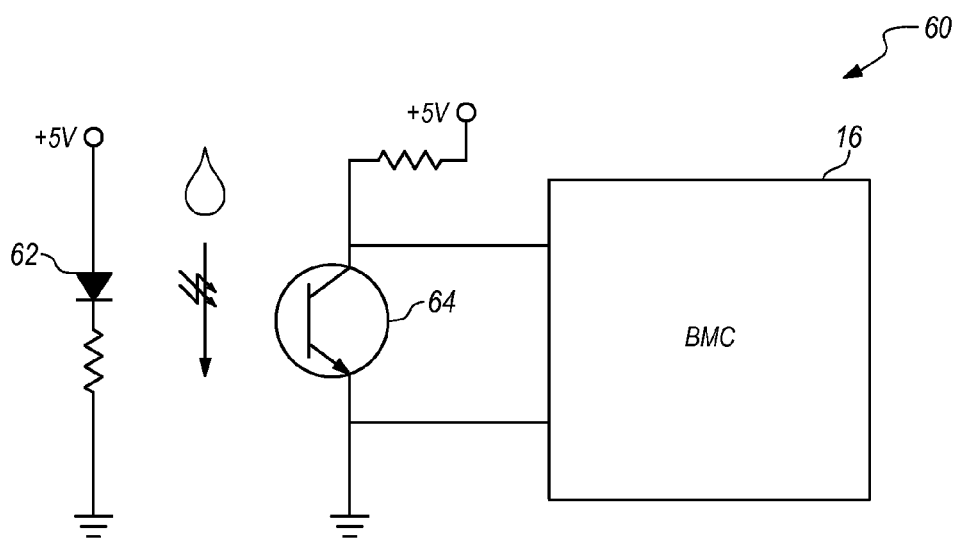
FIG. 4 is a diagram of a droplet detection circuit and configuration.

FIG. 4 is a diagram of a droplet detection circuit or droplet detector 60. In this example, the droplet detector 60 includes a light emitting diode 62 directly across from, and directed toward, a photodiode or phototransistor 64. Accordingly, light emitted by the light emitting diode 62 is sensed by the photodiode or phototransistor 64. However, when a droplet momentarily passes between the light emitting diode 62 and the photodiode or phototransistor 64, the current produced by the photodiode or phototransistor 64 is momentarily interrupted. Accordingly, the BMC receives a signal that allows counting of the number of droplets associated with the leak or leaks in the server. Based on the known average volume per drop of water, the rate of water leakage is determined.

Figure 5:
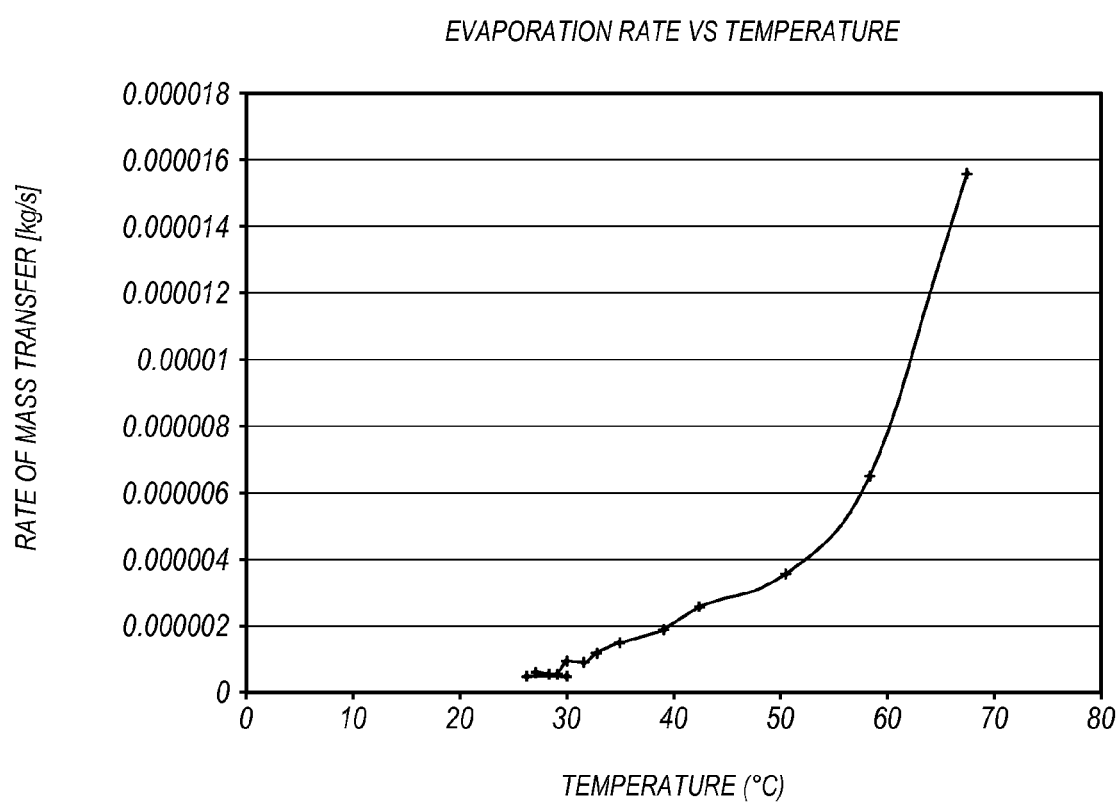
FIG. 5 is a graph of water evaporation rate as a function of ambient temperature.

FIG. 5 is a graph of water evaporation rate (kg/second) as a function of ambient temperature (° C.) obtained from the website:
http://tuhsphysics.ttsd.k12.or.us/Research/IB05/Cintron/tonycintronres.htm While the evaporation rate of water is influenced by: (1) the temperature of the water at the air-water surface; (2) the humidity of the air; (3) the area of the air-water interface; and (4) the temperature of the air, it is reasonable to assume that the temperature and humidity of the air in a datacenter will be relatively constant, and that the area of an air-water interface is constant (or at least limited) for any given containment container. Therefore, the temperature of the water is the most significant factor determining the amount of evaporation that will occur. For any given water temperature, it is possible to calculate an evaporation rate (i.e., mass of water loss per second).

For example, assume that the nominal operating temperature for the server is 25° C. Extrapolating the graph in FIG. 5, it is determined that 0.5×10-3 grams per second can be evaporated. The evaporation rate increases to 2×10-3 grams per second at a temperature of 40° C. Interestingly, the water evaporation rate at 40° C. is four times greater than it is at 25° C. In other words, it would take 2000 seconds (about 33 minutes) to evaporate one gram of water at 25° C. as compared to only 500 seconds (about 8 minutes) to evaporate the same amount of water at 40° C. Therefore, moving a job with a high thermal output to the area of leakage may cause a significant increase in the evaporation rate such that service to fix the leak can be delayed or at least conveniently scheduled.

Figure 6:
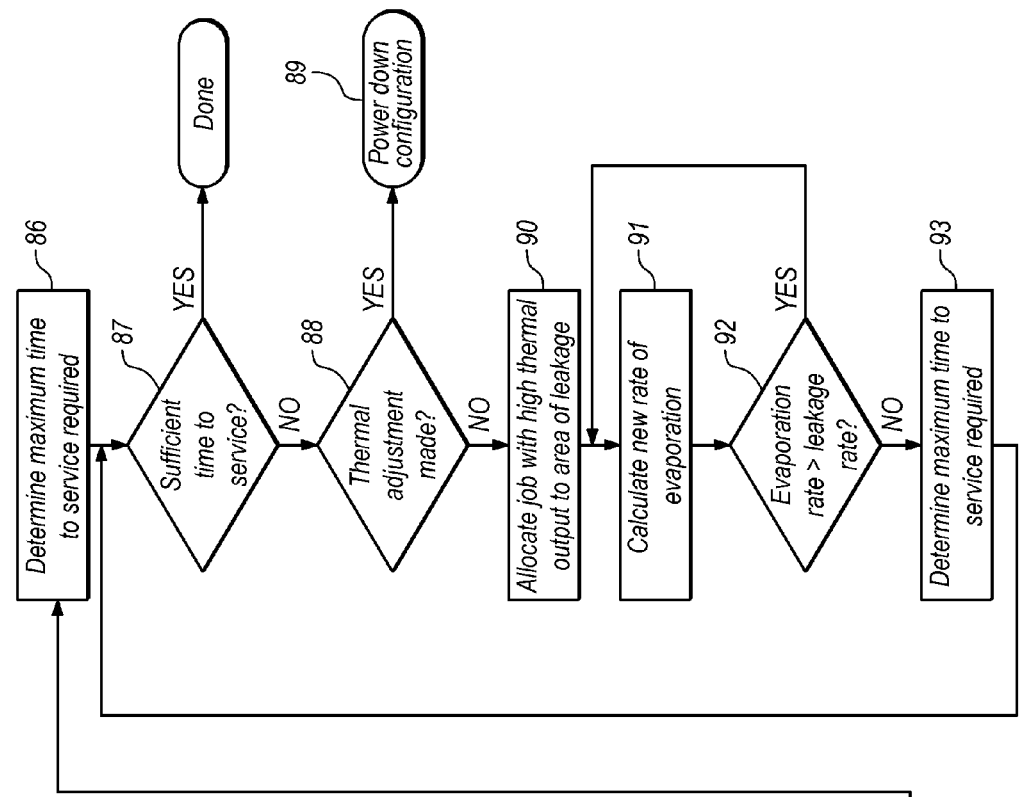
FIG. 6 is a flowchart of a method of managing water leaks in a node.
Figure 6:
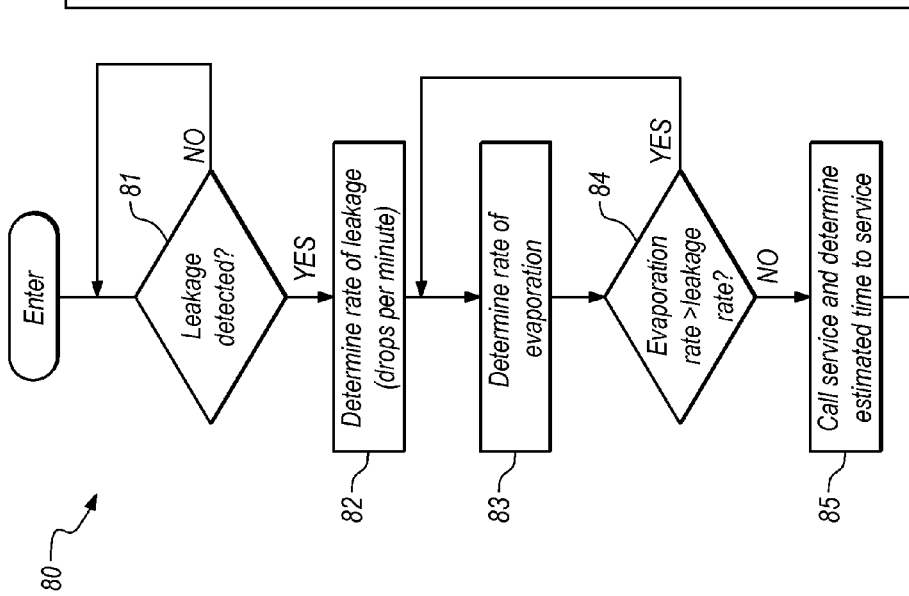

FIG. 6 is a flowchart of a method 80 of managing water leaks in a compute node. If water leakage is detected in step 81, then step 82 determines a rate of water leakage, such as in drops per minute. In step 83, the method determines a rate of water evaporation, such as in grams per unit of time. It should be understood that the water evaporation rate may change dynamically depending on the job executing in the server. Then, step 84 determines whether the water evaporation rate is greater than the water leakage rate. If so, then the water is not accumulating in the containment reservoir and no service call is required, such that the method returns to step 83. However, if the water evaporation rate is not greater than the water leakage rate, then step 85 issues a call for service to fix the leak and determines when service is estimated to occur (i.e., when is the next scheduled service available) and step 86 determines a maximum time to service required (when the containment reservoir will reach a critical level). Accordingly, step 87 determines whether there is sufficient time to service to leak before the containment reservoir reaches a critical level. If the next scheduled service is sufficient or soon enough, then the method is done or starts over. If the next scheduled service is not sufficient (i.e., not soon enough to avoid a critical level), then step 88 determines whether a thermal adjustment has already been made. If a thermal adjustment has already been made and the containment reservoir will reach a critical level before service will occur, then step 89 powers down the configuration or server. If a thermal adjustment has not already been made, then step 90 allocates a job with high thermal output to the area of the water leakage, before step 91 calculates a new rate of evaporation (i.e., at a new, higher temperature resulting from executing the job with high thermal output). In step 92, the method determines whether the water evaporation rate is greater than the water leakage rate. If so, then the water is no longer accumulating in the containment reservoir, such that the method returns to step 91. However, if the water evaporation rate is not greater than the water leakage rate in step 92, then step 93 determines a new maximum time to service required (when the containment reservoir will reach a critical level before the method returns to step 87.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention may be described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
    circulating water through a cooling system within a compute node to remove heat from a heat-generating component within the compute node;
    collecting water leakage from the cooling system into a containment reservoir within the compute node;
    measuring a rate of the water leakage;
    measuring a temperature of the compute node;
    determining a rate of water evaporation from the containment reservoir based upon the measured temperature; and
    comparing the rate of water leakage and the rate of water evaporation to determine whether water is accumulating in the containment reservoir.

2. The method of claim 1, further comprising:
    if the rate of water leakage is greater than the rate of water evaporation, determining the rate of water accumulation in the containment reservoir.

3. The method of claim 2, further comprising:
    determining a time period before the water in the containment reservoir will reach a critical level by dividing a known volume of the containment reservoir by the rate of water accumulation.

4. The method of claim 3, further comprising:
    identifying a job that can be completed by the compute node within the time period; and
    scheduling the identified job to be run by the compute node.

5. The method of claim 1, wherein determining a rate of water evaporation from the containment reservoir based upon the measured temperature, includes accessing a predetermined correlation between the rate of water evaporation and the measured temperature.

6. The method of claim 1, wherein the compute node includes a baseboard management controller, and wherein the base board management controller receives an electronic signal from a droplet detector to determine the rate of water leakage.

7. The method of claim 6, wherein determining the rate of water leakage includes counting drops of water as a function of time.

8. The method of claim 7, wherein the droplet detector includes a light source and a light sensor disposed at a drop location.

9. The method of claim 1, further comprising:
    directing the water leakage from a water collection pan to a drop location above the containment reservoir, wherein the droplet detector is disposed between the drop location and the containment reservoir.

10. The method of claim 1, further comprising:
    scheduling an additional job to the compute node in order to increase the rate of evaporation from the containment reservoir within the compute node.

11. The method of claim 10, wherein the additional job is an industry standard benchmark workload.

12. The method of claim 1, further comprising:
    migrating a job to the compute node from another compute node.

13. The method of claim 1, further comprising:
    migrating a first job to the compute node from a second compute node; and
    migrating a second job from the second compute node to the compute node, wherein execution of the first job generates more heat than execution of the second job.

14. The method of claim 1, further comprising:
    managing workload handled by a target heat-generating component within the compute node to increase the rate of evaporation, wherein the target heat-generating component is in thermally conductive communication with the containment reservoir.

15. The method of claim 1, further comprising:
    determining a priority for servicing the water leakage in the compute node among a plurality of compute nodes each experiencing water leakage.

16. A computer program product comprising a computer readable storage medium having program instructions embodied therewith, the program instructions executable by a processor to cause the processor to perform a method comprising:
    measuring a rate of water leakage from a cooling system within a compute node into a containment reservoir within the compute node;
    measuring a temperature of the compute node;
    determining a rate of water evaporation from the containment reservoir based upon the measured temperature; and
    comparing the rate of water leakage and the rate of water evaporation to determine whether water is accumulating in the containment reservoir.

17. The computer program product of claim 16, the method further comprising:
    determining a rate of water accumulation in the containment reservoir; and
    determining a time period before the water in the containment reservoir will reach a critical level by dividing a known volume of the containment reservoir by the rate of water accumulation.

18. The computer program product of claim 16, wherein determining a rate of water evaporation from the containment reservoir based upon the measured temperature, includes accessing a predetermined correlation between the rate of water evaporation and the measured temperature.

19. The computer program product of claim 16, the method further comprising:
    scheduling an additional job to the compute node in order to increase the rate of evaporation from the containment reservoir within the compute node.

20. The computer program product of claim 16, the method further comprising:

determining a priority for servicing the water leakage in the compute node among a plurality of compute nodes each experiencing water leakage.

\* \* \* \* \*